US012578640B2

(12) United States Patent
Hsieh et al.

(10) Patent No.: US 12,578,640 B2
(45) Date of Patent: Mar. 17, 2026

(54) PHOTOSENSITIVE MATERIAL FOR PHOTORESIST AND LITHOGRAPHY

(71) Applicant: Taiwan Semiconductor Manufacturing Company, Ltd., Hsinchu (TW)

(72) Inventors: Wei-Che Hsieh, Taipei (TW); Yu-Chung Su, Hsinchu (TW); Chia-Ching Chu, Hsinchu County (TW); Tzu-Yi Wang, Hsinchu (TW); Ta-Cheng Lien, Cyonglin Township (TW); Hsin-Chang Lee, Zhubei (TW); Ching-Yu Chang, Yuansun (TW); Yahru Cheng, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 692 days.

(21) Appl. No.: 17/695,069

(22) Filed: Mar. 15, 2022

(65) Prior Publication Data

US 2023/0087992 A1 Mar. 23, 2023

Related U.S. Application Data

(60) Provisional application No. 63/227,388, filed on Jul. 30, 2021.

(51) Int. Cl.

| | |
|---|---|
| ***G03F 7/039*** | (2006.01) |
| ***G03F 7/004*** | (2006.01) |
| ***G03F 7/32*** | (2006.01) |
| ***G03F 7/40*** | (2006.01) |

(52) U.S. Cl.

CPC .......... *G03F 7/0392* (2013.01); *G03F 7/0045* (2013.01); *G03F 7/322* (2013.01); *G03F 7/40* (2013.01)

(58) Field of Classification Search

None

See application file for complete search history.

(56) References Cited

U.S. PATENT DOCUMENTS

| | | | | |
|---|---|---|---|---|
| 8,841,058 | B2 | 9/2014 | Chang | |
| 9,436,086 | B2 | 9/2016 | Su et al. | |
| 9,665,004 | B2 | 5/2017 | Chang | |
| 9,921,480 | B2 | 3/2018 | Lai et al. | |
| 10,866,515 | B2 | 12/2020 | Weng et al. | |
| 11,016,386 | B2 | 5/2021 | Zi et al. | |
| 2003/0194641 | A1* | 10/2003 | Mizutani | G03F 7/0397 430/920 |
| 2003/0215735 | A1* | 11/2003 | Wheland | G03F 7/0046 526/253 |
| 2004/0076906 | A1* | 4/2004 | Barclay | C07C 69/54 430/905 |
| 2016/0246175 | A1* | 8/2016 | Kotake | C08F 220/26 |
| 2018/0044459 | A1* | 2/2018 | Ishimaru | C07C 309/68 |
| 2020/0048191 | A1* | 2/2020 | Suga | C07C 43/315 |
| 2020/0135451 | A1* | 4/2020 | Zi | H01L 21/0274 |

FOREIGN PATENT DOCUMENTS

KR 20050010146 A * 1/2005

OTHER PUBLICATIONS

KR20050010146 English Translation (Year: 2025).*

Hiroshi Ito, Chemical Amplification Resists for Microlithography, Adv Polym Sci (2005) 172:37-245.

* cited by examiner

*Primary Examiner* — Mark F. Huff

*Assistant Examiner* — Kevin J Drummey

(74) *Attorney, Agent, or Firm* — Lippes Mathias LLP

(57) ABSTRACT

Photosensitive polymers and their use in photoresists for photolithographic processes are disclosed. The polymers are copolymers, with at least one monomer that includes pendant polycyclic aromatic groups and a second monomer that includes an acidic leaving group (ALG). The polymers have high resistance to etching and high development contrast.

20 Claims, 2 Drawing Sheets

Coat the photoresist composition onto a material layer ~100

Bake the photoresist to form a photoresist layer ~110

Pattern the photoresist layer via radiation exposure ~120

Optionally, post exposure bake (PEB) the photoresist layer ~122

Develop the photoresist layer using a developer to obtain a photoresist pattern ~130

Optionally, post develop bake photoresist layer ~132

140

150

160

Dry etch the exposed material layer

Implant ions in the exposed material layer

Deposit different material upon the exposed material layer

Remove the photoresist layer ~170

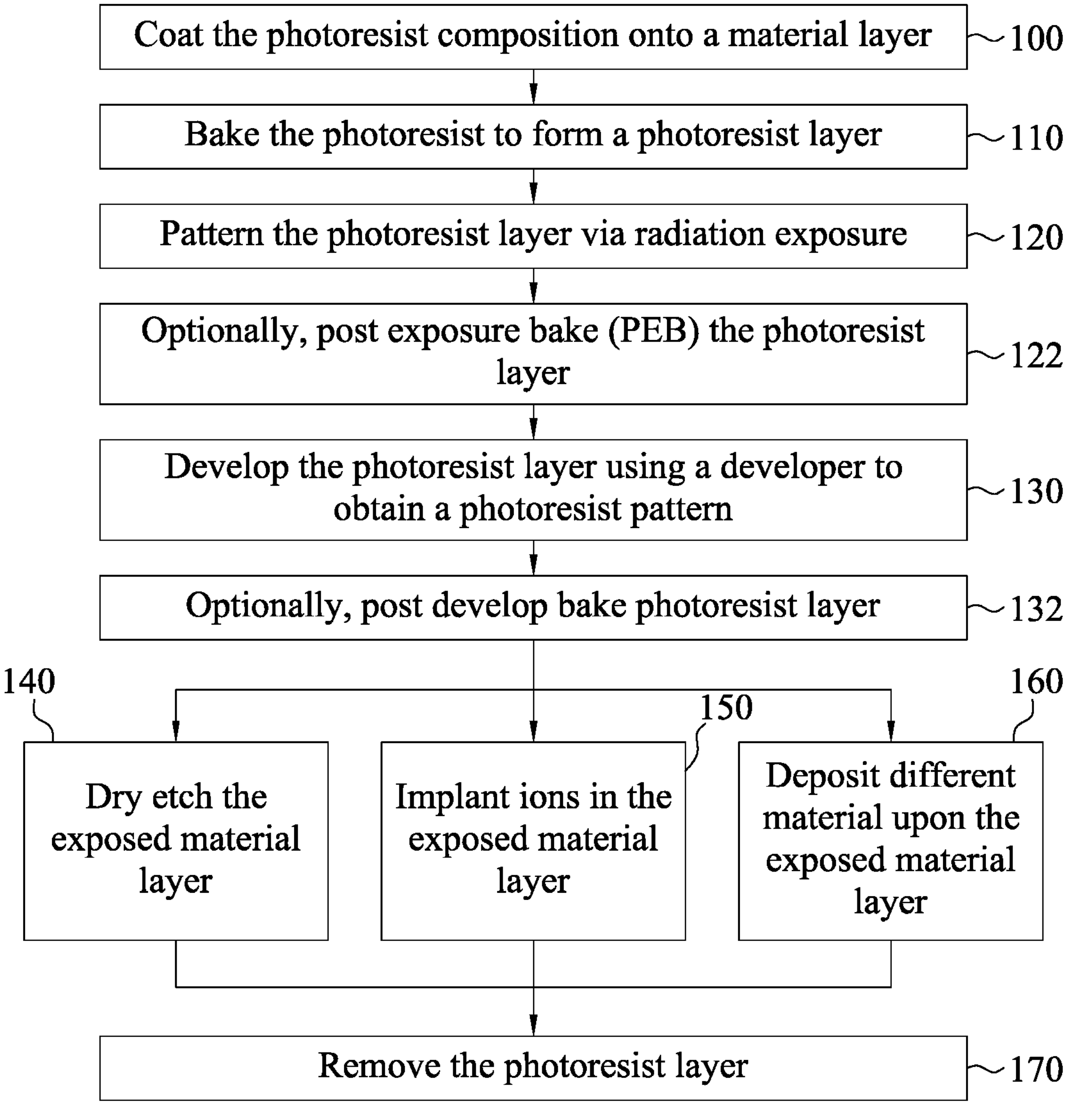

FIG. 1

PHOTOSENSITIVE MATERIAL FOR PHOTORESIST AND LITHOGRAPHY

PRIORITY CLAIM AND CROSS-REFERENCE

This application claims priority to U.S. Provisional Patent Application Ser. No. 63/227,388, filed on Jul. 30, 2021, which is incorporated by reference in its entirety.

BACKGROUND

Integrated circuits are formed on a semiconducting wafer substrate. Photolithographic patterning processes use ultraviolet light to transfer a desired mask pattern to a photoresist on the semiconducting wafer substrate. Etching processes, such as dry etching, may then be used to transfer to the pattern to a material layer below the photoresist. This process is repeated multiple times with different patterns and different materials in various layers to build circuits and components on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flowchart showing a method of the present disclosure, in accordance with some embodiments.

FIG. 2A illustrates a first method step.

FIG. 2B illustrates a second method step.

FIG. 2C illustrates a third method step.

FIG. 2D illustrates a fourth method step.

FIG. 2E illustrates a fifth method step.

FIG. 2F illustrates an alternative fifth method step.

FIG. 2G illustrates another alternative fifth method step.

DETAILED DESCRIPTION

Figure 2A:
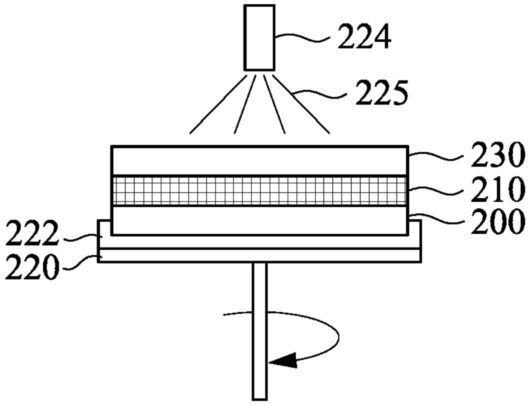
FIGS. 2A-2G are diagrams illustrating various steps of the method of FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure may refer to temperatures for certain method steps. It is noted that these references are to the temperature at which the heat source is set, and do not specifically refer to the temperature which must be attained by a particular material being exposed to the heat.

The terms "upon" or "on", when used in reference to a second layer being upon or on a first layer, are intended to refer to the first layer as being the bottom or support for all of the layers and components which are on or upon the first layer. In other words, unless dictated by the context, these terms should not be construed as requiring the second layer to directly contact the first layer. These terms should be construed as permitting other layers to be between the first layer and the second layer.

As used herein, the term "copolymer" refers to a polymeric molecule derived from two or more monomers, as opposed to a homopolymer, which is a molecule derived from only one monomer. The term "dipolymer" refers to a molecule derived from only two different monomers. The term "terpolymer" refers to a molecule derived from only three different monomers. The term "tetrapolymer" refers to a molecule derived from only four different monomers.

The terms "monomer" and "repeating unit" are used interchangeably in the text. A repeating unit is derived from a monomer, and they differ in a known manner in their structure.

The present disclosure relates to photoresist compositions and methods for using such compositions in photolithographic processes for manufacturing integrated circuits/semiconductor devices. In this regard, photoresist compositions are typically coated onto a substrate, for example by spin-coating, and may also be cured by baking. The photoresist contains a photosensitive material. A mask pattern is used to expose desired portions of the photoresist to radiation, such as ultraviolet light or an electron beam. The photoresist is then developed using a chemical solution (known as developer). The developer removes portions of the photoresist (i.e. exposed portions in a positive-tone photoresist or unexposed portions in a negative-tone photoresist), so that the mask pattern is transferred to the photoresist layer. The patterned photoresist layer can then be used as an etch mask for subsequent etching processes that transfer the pattern to an underlying material layer.

The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. At such wavelengths, the photosensitive materials need to use the light as efficiently as possible. The efficiency of the photoresist can be increased using chemical amplification. In a chemically amplified resist or CAR, the photoresist composition includes a photosensitive polymer, a photoacid generator (PAG), and a quencher. Upon exposure to radiation, the PAG generates an acid. The acid cleaves an acid leaving group on the polymer to change the solubility of the polymer. This also produces an acid, which can continue the reaction. Such a chain reaction will be terminated only when the acid produced comes in contact with a base, also referred to as a quencher. The balance between the acids and the quencher determines the fidelity of the photoresist pattern, e.g. whether the sidewalls are straight or not.

The photoresist compositions of the present disclosure include a photosensitive copolymer which have a monomer with a pendant polycyclic aromatic group. This pendant group can absorb short wavelengths to release electrons that react with the PAG to generate an acidic environment. In addition, the copolymer has high etching resistance, which increases pattern fidelity. The use of the photosensitive copolymer increases the quantum efficiency of the photolithography process. The photoresist compositions may further include a photoacid generator (PAG), a quencher, and a solvent.

The photosensitive copolymer is derived from two or more monomers, and contains a backbone with pendant groups or sidechains extending therefrom. The photosensitive copolymer contains pendant polycyclic aromatic groups and acid leaving groups. The photosensitive copolymer is devoid of or deficient in pendant carboxyl groups (or protected derivatives thereof). Put another way, the photosensitive copolymer does not contain pendant carboxyl groups (or protected derivatives thereof).

The backbone of the photosensitive copolymer is typically a hydrocarbon chain, for example formed from the polymerization of vinyl groups present in the monomers forming the copolymer. In particular embodiments of the present disclosure, the photosensitive copolymer is formed from two or three different monomer types. These forms of the photosensitive copolymer are illustrated in Formula (I) and Formula (II) below:

$$—[M1]_x—[M2]_y— \quad \text{Formula (I)}$$

$$—[M1]_x—[M2]_y—[M3]_z— \quad \text{Formula (II)}$$

wherein M1, M2, and M3 are respectively different repeating units/monomers; x is the molar ratio of monomer M1; y is the molar ratio of monomer M2; z is the molar ratio of monomer M3; and x+y=1 in Formula (I); and x+y+z=1 in Formula (II).

In particular embodiments of Formula (I) and Formula (II), x is at least 0.001. In more specific embodiments, x is from about 0.001 to about 0.3. Similarly, y is at least 0.1, and may range from about 0.1 to about 0.999. In Formula (III), z is from greater than 0 to about 0.7.

Monomer M1 may be considered a first monomer type, monomer M2 may be considered a second monomer type, and monomer M3 may be considered a third monomer type. More specifically, in both Formula (I) and Formula (II), the first monomer (M1) comprises a pendant polycyclic aromatic group, and the second monomer (M2) comprises an acid leaving group (ALG).

The first monomer type M1 increases etching resistance. In particular embodiments, the pendant polycyclic aromatic group of the first monomer M1 is a naphthalene, indene, biphenyl, fluorene, anthracene, or phenanthrene group. Examples of such repeating units M1 are illustrated below as Formulas (A)-(F):

Formula (A)

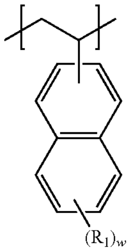

Formula (B)

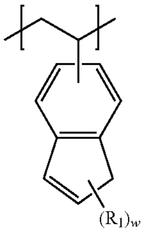

Formula (C)

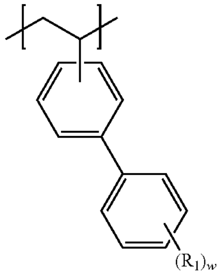

Formula (D)

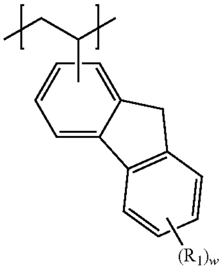

Formula (E)

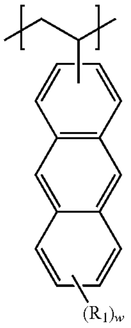

-continued

Formula (F)

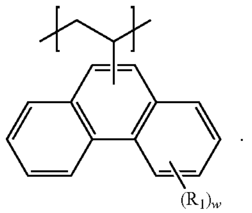

The polycyclic aromatic group may be bonded to the polymer backbone through any available carbon atom. In Formulas (A)-(E), w is an integer from 0 to 3; and each $R_1$ is a substituent which is independently —OH; C1-C15 alkyl; C1-C15 ether or polyether containing 1-3 oxygen atoms; C1-C15 carbonate; C1-C15 acetal; a C3-C15 tertiary alcohol; a C3-C15 vic-diol; halogen; amino; nitro; or cyano; or protected derivatives thereof.

The term "alkyl" refers to a radical composed entirely of carbon atoms and hydrogen atoms which is fully saturated (i.e. does not contain double or triple bonds). The alkyl radical may be linear, branched, or cyclic.

The term "ether" refers to a radical of the formula —R'—O—R"—, where R' and R" are alkyl groups. It is noted that a carboxyl group (—CO—OR") or carbonate group (—O—CO—OR") should not be considered an ether group.

The term "carbonate" refers to a radical of the formula —O—CO—OR", where R" is hydrogen or alkyl, and also refers to the salt thereof. The carbonate radical bonds through the oxygen atom to the polycyclic aromatic group.

The term "acetal" refers to a radical of the formula —CH(OR')(OR"), where R' and R" are alkyl.

The term "aryl" refers to an aromatic radical composed entirely of carbon atoms, and optionally hydrogen atoms along the perimeter of the radical. As used herein, an aryl group has from 6 to about 18 carbon atoms. The term "aryl" should not be construed as including substituted aromatic radicals, such as methylphenyl group (7 carbon atoms).

The term "tertiary alcohol" refers to a radical of the formula —C(OH)R'R", where R' and R" are alkyl or aryl.

The term "vic-diol" refers to a hydrocarbon radical with two hydroxyl groups on adjacent carbon atoms.

The term "halogen" refers to fluorine, chlorine, bromine, and iodine.

The term "amino" refers to a radical of the formula $—NR^1R^2$, where $R^1$ and $R^2$ are independently hydrogen or alkyl. This includes monosubstituted radicals (i.e. where $R^2$ is hydrogen) and disubstituted radicals (where neither $R^1$ nor $R^2$ are hydrogen).

The term "nitro" refers to a radical of the formula $—NO_2$.

The term "cyano" refers to a radical of the formula —C≡N.

The term "carboxyl" refers to a radical of the formula —CO—OR", where R" is hydrogen or alkyl, and also refers to the salt thereof. The carboxy radical bonds through the carbon atom. It is noted that a carbonate group (—O—CO—OR") should not be considered a carboxyl group.

It is noted that in some embodiments, these substituents may be protected, i.e. be a protected derivative of the original substituent. Generally, a protecting group is a reversibly formed derivative of the substituent. The protecting group is temporarily attached to decrease reactivity, so that the protected substituent does not react under synthetic conditions to which the molecule is subjected in one or more subsequent steps. For example, protecting groups for amino substituents can include carbamates, acetamides, benzylamine, triphenylamine, or p-toluenesulfonamide. Such protected substituents are also contemplated as falling within the scope of the present disclosure.

In some particular embodiments of the present disclosure, in monomer M1, w is 1 to 3, or in other words the monomer includes at least one $R_1$ group.

In other particular embodiments, the $R_1$ group of monomer type M1 is a polarity-switching group for positive-tone or negative-tone development. In a positive tone photoresist, the portion exposed to radiation becomes soluble in the developer. In a negative tone photoresist, the portion exposed to radiation becomes insoluble in the developer. In some embodiments, at least one $R_1$ group is C1-C15 ether or polyether containing 1-3 oxygen atoms; C1-C15 carbonate; or C1-C15 acetal. Such substituents may be useful for positive tone imaging, In other embodiments, at least one $R_1$ group is C3-C15 tertiary alcohol; or C3-C15 vic-diol. These substituents may be useful for negative tone imaging, Formula (III) below illustrates one example of how a carbonate group changes polarity in an acidic environment, switching from a hydrophobic moiety to a hydrophilic moiety:

Formula (III)

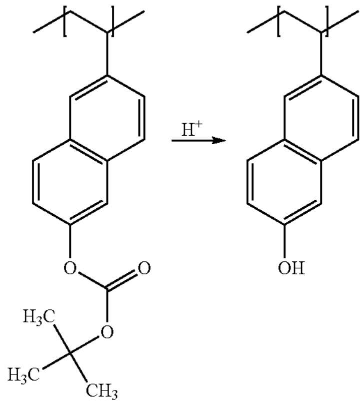

Formula (IV) below illustrates how a tertiary alcohol group changes polarity in an acidic environment, switching from a hydrophilic moiety to a hydrophobic moiety. Formula (V) below illustrates how a vic-diol group changes polarity in an acidic environment, switching from a hydrophilic moiety to a hydrophobic moiety.

Formula (IV)

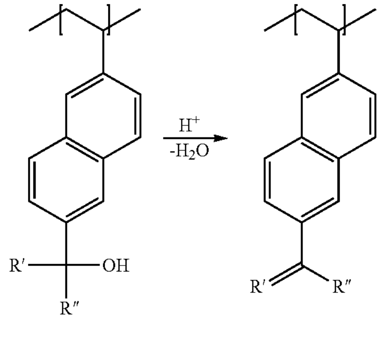

-continued

Formula (V)

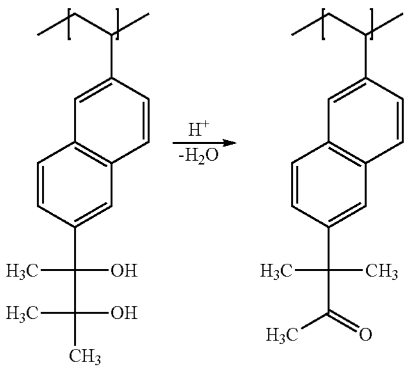

Continuing, the first monomer type M1 containing the pendant polycyclic aromatic group may be present in the photosensitive copolymer of both Formulas (I) and (II) in the amount of about 0.1 mole % to about 30 mole % of the copolymer. In some specific embodiments, there is a single monomer M1 having a pendant polycyclic group present in the photosensitive copolymer. However, it is also contemplated that more than one such monomer M1 may be present. If more than one such monomer M1 is present, they should be considered together, i.e. the sum of the monomers M1 is from about 0.1 mole % to about 30 mole % of the copolymer.

Continuing, the second monomer type (M2) comprises at least one acid leaving group (ALG), and is a different monomer from the first monomer (M1). An ALG is a group that decomposes upon reaction with an acid. Some examples of ALGs include an alkoxy group; a sulfonic group; a sulfonamide group; a fluorinated alcohol group; a phenolic alcohol group; an imido or methylene group substituted with one or more sulfonyl, alkylsulfonyl, or alkylcarbonyl groups; an alkylcarbonate group; an acetal group, and a hemiacetal group. In more specific embodiments, the alkoxy group contains 4 to 20 carbon atoms, and the alkyl portion may be linear or cyclic. The second monomer thus provides for chemical amplification. Again, the second monomer is devoid of, or does not contain, a pendant carboxyl group.

The term "alkoxy" refers to an alkyl radical which is attached to an oxygen atom, i.e. $—O—C_nH_{2n+1}$.

The term "sulfonic" refers to a radical of the formula $—SO_3—R$, where R is hydrogen or alkyl.

The term "sulfonamide" refers to a radical of the formula $—SO_2—NR'R''$, where where R' and R" are independently hydrogen or alkyl.

The term "fluorinated alcohol" refers to a radical of the formula $—O—C_xH_yF_z$, where x is 1 or more, z is 1 or more, y is 0 or more, and $(y+z)\leq(2x+1)$.

The term "phenolic alcohol" refers to a radical of the formula $—O—C_6H_5$.

The term "imido" refers to a radical of the formula —CO—NH—COH.

The term "sulfonyl" refers to a radical of the formula $—SO_2—R$, where R is hydrogen or alkyl.

The term "alkylsulfonyl" refers to a radical of the formula $—R''—SO_2—R$, where R is hydrogen or alkyl, and R" is alkyl.

The term "alkylcarbonyl" refers to a radical of the formula —R"—CO—R, where R is hydrogen or alkyl, and R" is alkyl.

The term "alkylcarbonate" refers to a radical of the formula —R"—O—CO—OR, where R and R" are alkyl.

The term "acetal" refers to a radical of the formula —R"—C(OR)(OR')R"', where R, R' and R" are alkyl, and R"' is hydrogen or alkyl.

The term "hemiacetal" refers to a radical of the formula —R"—C(OR)(OH)R' where R and R" are alkyl, and R' is hydrogen or alkyl.

The acid leaving group (ALG) is a substituent of a pendant group, such as a phenyl group or any of the polycyclic aromatic groups of Formulas (A)-(F). Generally, the ALG is attached to the pendant group through an oxygen or nitrogen atom. Some examples of repeating units M2 are illustrated below as Formulas (G)-(N):

Formula (G)

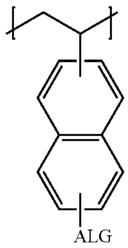

Formula (H)

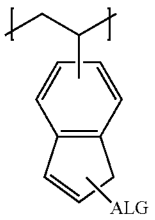

Formula (J)

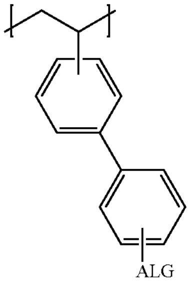

Formula (K)

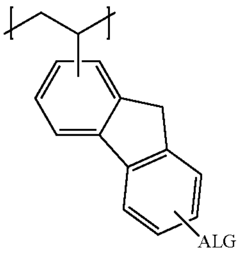

-continued

Formula (L)

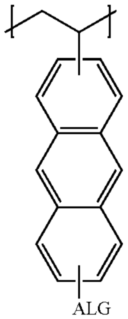

Formula (M)

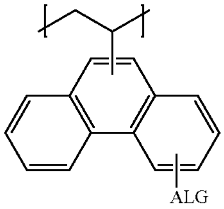

Formula (N)

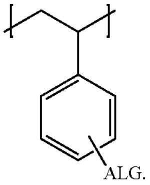

In Formulas (G)-(N), ALG refers to the acid leaving group. Typically, there is only one ALG in each monomer M2, but the number of ALGs may vary as desired.

In some specific embodiments, there is a single monomer M2 having comprising an ALG present in the photosensitive copolymer. In more specific embodiments, the single monomer M2 is a monomer of Formula (N). In some alternative embodiments, more than one second monomer type is present, with the second monomers being different from each other. As one non-limiting example, the copolymer may include second monomers of both Formula (G) and Formula (N). If more than one second monomer is present, they may have the same or different ALG.

The second monomer type M2 containing the ALG may be present in the photosensitive copolymer of both Formulas (I) and (II) in the amount of about 10 mole % to about 99.9 mole % of the copolymer, or in more specific embodiments from about 70 mole % to about 99.9 mole %. If more than one monomer M2 is present, their amounts should be considered together, i.e. the sum of the monomers M2 is from about 10 mole % to about 99.9 mole % of the copolymer.

The copolymer of Formula (II) also contains a third monomer type M3. The third monomer may be any desirable monomer that also does not contain a pendant carboxyl group, and for example may be used to control the dissolution rate of the photosensitive copolymer. Some non-limiting examples of suitable monomers M3 may include ethylene or styrene, hydroxystyrene, acrylamide, acrylonitrile, or vinyl fluoride, which are illustrated below as Formulas (O)-(S), respectively:

Formula (O)

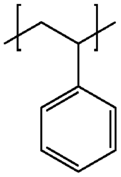

Formula (P)

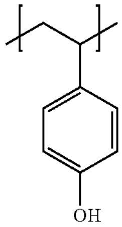

Formula (Q)

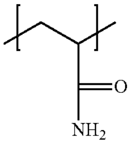

Formula (R)

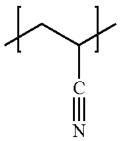

Formula (S)

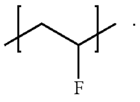

The third monomer type M3 may be present in the photosensitive copolymer of Formula (II) in the amount of greater than 0 mole % to about 70 mole % of the copolymer. Again, in some specific embodiments, there is a single monomer M3 present in the photosensitive copolymer, but more than one such monomer M3 may be present. If more than one such monomer M3 is present, they should be considered together, i.e. the sum of the monomers M3 is from greater than 0 mole % to about 70 mole % of the copolymer.

As indicated above, there are generally three different monomer types, but there may be more than one monomer of each monomer type present in the photosensitive copolymer. Depending on the polymerization mixture, there could be two, three, four, or even five different monomers present in the copolymer.

Two specific non-limiting examples of photosensitive copolymers according to Formula (I) and Formula (II) are presented below (where the ALG is hexafluoroisopropanol):

Formula (I-a)

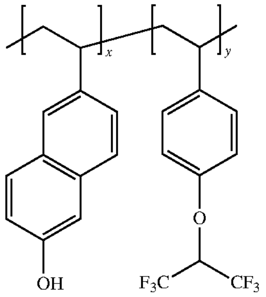

Formula (II-a)

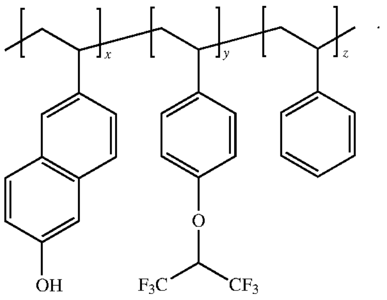

The photosensitive copolymers can be prepared from conventional monomers using conventional polymerization techniques. Any suitable step-growth or chain-growth polymerization process may be used, such as addition polymerization, free radical polymerization, condensation polymerization, emulsion polymerization, solution polymerization, suspension polymerization, or precipitation polymerization.

The photosensitive copolymer may have a weight average molecular weight (Mw) of from about 3,000 to about 20,000.

The photosensitive copolymer has relatively high etching resistance. High etching resistance (or low etch rate) can be measured in terms of the Ohnishi parameter (OP) of the copolymer. The Ohnishi parameter is determined by the following equation:

$$OP = \sum_{1}^{n} k_n \frac{N_{tot}}{N_C - N_O}$$

where n is the number of monomers; $k_n$ is the mole fraction of each monomer; $N_{tot}$ is the total number of atoms in the monomer; $N_C$ is the total number of carbon atoms in the monomer; and $N_O$ is the total number of oxygen atoms in the monomer. For example, polystyrene is made from styrene ($C_8H_8$), which has an OP of (16/(8−0))=2. Similarly, the OP of poly(methyl methacrylate) is 5, and the OP of poly(hydroxystyrene) is 2.42.

A lower OP indicates a copolymer with higher etching resistance. In particular embodiments of the present disclosure, the photosensitive copolymer has an Ohnishi parameter of 4.0 or lower, or an OP of 3.5 or lower, or an OP of 3.0 or lower, or an OP of 2.6 or lower, or an OP of 2.4 or lower, or an OP of 2.2 or lower, or an OP of 2.0 or lower.

Upon exposure to radiation, the various aromatic groups on the pendant groups of the photosensitive copolymer release electrons that react with the photoacid generators to generate acid. In turn, the acid leaving groups are released, changing the solubility of the photosensitive copolymer. The photon absorption efficiency of the pendant polycyclic aromatic groups is believed to be higher, which also improves contrast between the exposed and unexposed portions of the photoresist.

The use of the photosensitive copolymer increases etching resistance, which improves pattern fidelity. Ideally, for example, a designed square corner should be developed and etched as square without rounding of the corner. The photosensitive copolymer also has reduced dark loss (i.e. the thickness of unexposed photoresist that is removed by developer).

The photosensitive copolymer is one component of a photoresist composition. Other components of the photoresist composition include a photoacid generator (PAG), a quencher, and a solvent. Other optional components may include a surfactant, a sensitizer, a crosslinking agent, a stabilizer, a dissolution inhibitor, a plasticizer, a colorant, an adhesion promoter, and/or a surface leveling agent.

Non-limiting examples of PAGs may include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of PAGs include α-(trifluoromethylsulfonyloxy)-bicyclo[2.2.1]hept-5-ene-2,3-dicarboximide (MDT); N-hydroxy-naphthalimide (DDSN); benzoin tosylate; t-butylphenyl-α-(p-toluenesulfonyloxy)-acetate; t-butyl-α-(p-toluenesulfonyloxy)-acetate; triarylsulfonium and diaryliodonium hexafluoroantimonates; hexafluoroarsenates; trifluoromethanesulfonates; iodonium perfluorooctanesulfonate; N-camphorsulfonyloxynaphthalim ide; N-pentafluorophenylsulfonyloxynaphthalimide; ionic iodonium sulfonates such as diaryl iodonium (alkyl or aryl) sulfonate and bis-(di-t-butylphenyl)iodonium camphanylsulfonate; perfluoroalkanesulfonates such as perfluoropentanesulfonate, perfluorooctanesulfonate, or perfluoromethanesulfonate; aryl triflates such as triphenylsulfonium triflate or bis-(t-butylphenyl)iodonium triflate; pyrogallol derivatives (e.g., trimesylate of pyrogallol); trifluoromethanesulfonate esters of hydroxyimides; α,α'-bis-sulfonyl-diazomethanes; sulfonate esters of nitro-substituted benzyl alcohols; naphthoquinone-4-diazides; ethanone; and alkyl disulfones.

A quencher can be used to inhibit diffusion of the generated acid within the photoresist, which improves the stability of the photoresist and also improves the resist pattern configuration. Non-limiting examples of quenchers include amines and organic acids. The amine may be a second lower aliphatic amine or a tertiary lower aliphatic amine. Specific examples of amine quenchers include trimethylamine; diethylamine; triethylamine; di-n-propylamine; tri-n-propylamine; tripentylamine; diethanolamine; triethanolamine; and other alkanolamine.

Examples of organic acids that can be used as quenchers may include malonic acid; citric acid; malic acid; succinic acid; benzoic acid; salicylic acid; phosphoric acid and derivatives thereof such as phosphoric acid di-n-butyl ester or phosphoric acid diphenyl ester; phosphonic acid and derivatives thereof such as phosphonic acid dimethyl ester, phosphonic acid di-n-butyl ester; phenylphosphonic acid, phosphonic acid diphenyl ester, or phosphonic acid dibenzyl ester; and phosphinic acid and derivatives thereof such as its esters or phenylphosphinic acid.

The photosensitive copolymer and other additives/components are mixed or blended together in the solvent to form the photoresist composition. In particular embodiments, the solvent is an organic solvent. Examples of suitable organic solvents include ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of organic solvents include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, gamma-butyrolactone, α-methyl-gamma-butyrolactone, β-methyl-gamma-butyrolactone, gamma-valerolactone, gamma-caprolactone, gamma-octanoic lactone, α-hydroxy-gamma-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monopheylether, dipropylene glycol monoacetate, dioxane, ethyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyl acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, gamma-butyrolactone, ethylene carbonate, propylene carbonate, and phenyl cellosolve acetate.

A surfactant may be present in the photoresist composition. Upon development, the surfactant may facilitate the removal of residues from the photoresist layer. The surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

A sensitizer may be present in the photoresist composition. Upon irradiation, the sensitizer is designed to generate radiation of a different wavelength, such that the sensitivity of the photoresist material is substantially improved. In some embodiments, the sensitizer may include fluorine, a metal, or a phenol group, For example, the sensitizer may be polyhydroxystyrene (PHS) or polyfluorostyrene. Other sensitizers like organic iodides, bromides, chlorides, or magnesium-containing compounds which have a high electron-beam cross section could also be used. Other sensitizers may include those having the structure of Formula (1) or Formula (2):

Formula (1)

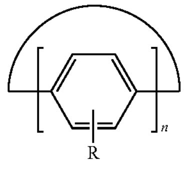

-continued

Formula (2)

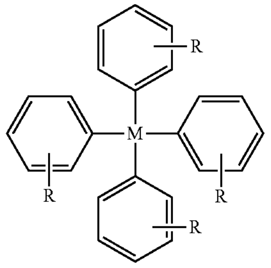

where R is independently hydroxyl, fluorine, alkyl fluoroalcohol, chlorine, or fluoroalkyl; M is carbon or silicon; and n is from 1 to 20.

A crosslinking agent may also be added to the photoresist composition. The cross-linking agent can react with the photosensitive copolymer after exposure, assisting in increasing the cross-linking density of the photoresist, which helps to improve the resist pattern and resistance to etching. Examples of cross-linking agents can include melamines, ureas, glycoluril compounds, aliphatic hydrocarbons having hydroxyl or thiol or hydroxyalkyl groups, alcohols, and etherified amino resins.

A stabilizer may be included in the photoresist composition. The stabilizer reduces diffusion of the acids generated during exposure of the photoresist composition. Examples of stabilizers include nitrogenous compounds such as aliphatic primary, secondary, and tertiary amines; cyclic amines such as piperidines, pyrrolidines, and morpholines; aromatic heterocycles such as pyridines, pyrimidines, and purines; imines; guanidines; imides; amides; ammonium salts; cationic nitrogenous compounds; phenolates; carboxylates; aryl and alkyl sulfonates; sulfonamides; and the like.

A dissolution inhibitor may be included in the photoresist composition to help control dissolution of the photoresist during development. Non-limiting examples of dissolution inhibitors include cholic acid, deoxycholic acid, lithocholic acid, t-butyl deoxycholate, t-butyl lithocholate, and t-butyl-3-α-acetyl lithocholate.

A plasticizer may be used in the photoresist composition to reduce delamination and cracking between the photoresist and the underlying layer upon which the photoresist layer is formed. Examples of plasticizers may include monomeric, oligomeric, and polymeric plasticizers such as oligo- and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine, and the like.

If desired, a colorant could be used to help in locating defects in the photoresist. Broad categories of colorants include dyes and pigments. More specific examples of colorants may include triarylmethane dyes, crystal violet, methyl violet, ethyl violet, malachite green, diamond green, phthalocyanine pigments, azo pigments, carbon black, titanium oxide, benzophenone compounds; salicylic acid compounds; phenylacrylate compounds; coumarin compounds; thioxanthone compounds; stilbene compounds; naphthalic acid compounds; azo dyes; and the like.

An adhesion promoter may be used in the photoresist composition to promote adhesion between the photoresist and the underlying layer upon which the photoresist layer is formed. Examples of adhesion promoters include silane compounds with at least one reactive substituent such as a carboxyl group, a methacryloyl group, an isocyanate group and/or an epoxy group.

Surface leveling agents may additionally be added to the photoresist composition, for leveling the top surface of the photoresist layer. Examples of surface leveling agents include fluoroaliphatic esters, hydroxyl terminated fluorinated polyethers, fluorinated ethylene glycol polymers, silicones, and acrylic polymer leveling agents.

The photoresist composition is used to form a photoresist layer that is used in various method for forming various structures in an integrated circuit or semiconductor device. One such method for forming a photoresist pattern and patterning a material layer in a semiconductor device is described in FIG. 1, and illustrated in FIGS. 2A-2G.

In step 100, the photoresist composition is coated onto a substrate. It is noted that the substrate may be any type of material layer in which a pattern is desired to be formed. The coating may be done, for example, by spin coating, or by spraying, roller coating, dip coating, or extrusion coating. Typically, in spin coating, the substrate is placed on a rotating platen, which may include a vacuum chuck that holds the substrate in plate. The photoresist composition is then applied to the center of the substrate. The speed of the rotating platen is then increased to spread the resist evenly from the center of the substrate to the perimeter of the substrate. The rotating speed of the platen is then fixed, which can control the thickness of the final photoresist layer.

In step 110, the photoresist composition is baked or cured to remove the solvent and harden the photoresist layer. In some particular embodiments, the baking occurs at a temperature of about 90° C. to about 110° C. The baking can be performed using a hot plate or oven, or similar equipment. As a result, the photoresist layer is formed on the substrate.

In step 120, the photoresist layer is patterned via exposure to radiation. The radiation may be any light wavelength which carries a desired mask pattern. In particular embodiments, DUV light with a wavelength of 193 nm or 248 nm or EUV light having a wavelength of about 13.5 nm is used. In other embodiments, e-beam radiation is used. This results in some portions of the photoresist layer being exposed to radiation, and some portions of the photoresist not being exposed to radiation. This exposure activates the photosensitive polymer, such that some portions of the photoresist will be soluble in the developer and some portions of the photoresist will not be soluble in the developer.

In optional step 122, an additional photoresist bake step (post exposure bake, or PEB) may occur after the exposure to radiation. This may help in releasing the acid leaving groups (ALGs) that are significant in chemical amplification.

In step 130, the photoresist layer is developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Other developers may include 2-heptanone, n-butyl acetate, isoamyl acetate, cyclohexanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, or isobutyl propionate. Generally, any suitable developer may be used.

In optional step 132, a post develop bake or "hard bake" may be performed to stabilize the photoresist pattern, for optimum performance in subsequent steps.

Continuing, portions of the material layer below the photoresist pattern are now exposed. In step 140, the material layer is etched, causing the exposed portions of the material layer to be removed, thus transferring the photoresist pattern to the material layer. In particular embodiments, the etching is performed by dry etching.

Besides etching of the material layer, other process steps may alternatively be carried out. For example, in alternative step 150, ions may be implanted into the exposed material layer instead, or as in alternative step 160, a different material can be deposited upon the material layer.

Finally, in step 170, the photoresist layer can then be removed. This can be done, for example, using various solvents such as N-methyl-pyrrolidone (NMP) or alkaline media or other strippers at elevated temperatures, or by dry etching using oxygen plasma.

FIGS. 2A-2G illustrate the various steps of FIG. 1. FIG. 2A illustrates step 100 of FIG. 1, where the photoresist is coated onto a substrate. The substrate 200 is a semiconducting wafer substrate that can be, for example, a wafer made of silicon, germanium arsenide (GaAs), or gallium nitride (GaN). Other materials are also contemplated as being within the scope of this disclosure.

As illustrated here, the substrate 200 includes a material layer (or underlayer) 210 to be processed. The material layer may generally serve any function. For example, the material layer could be a high-k dielectric layer, a gate layer, a hard mask layer, an interfacial layer, a capping layer, a diffusion/barrier layer, a dielectric layer (e.g. $SiO_2$), a conductive layer (e.g. doped polysilicon), or some other layer.

The substrate is located upon a rotating platen 220, which includes a vacuum chuck 222 for holding the substrate in place. A supply nozzle 224 over the center of the substrate/platen deposits photoresist composition 225 upon the substrate, and the rotation spreads the resist evenly from the center of the substrate to the perimeter of the substrate to form a photoresist layer 230.

Figure 2B:
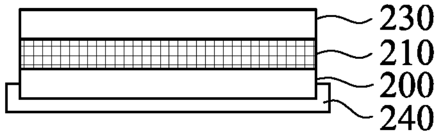

In FIG. 2B, the coated substrate 200 is baked or cured. As illustrated here, the substrate 200 is placed upon a hot plate 240 to remove the solvent and harden the photoresist layer 230. This illustrates step 110 of FIG. 1.

Figure 2C:
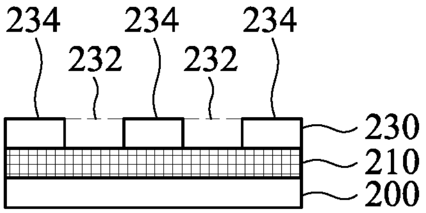

In FIG. 2C, the photoresist layer 230 has been patterned by exposure to radiation, resulting in soluble portions 232 and insoluble portions 234. This corresponds to step 120 of FIG. 1.

Figure 2D:
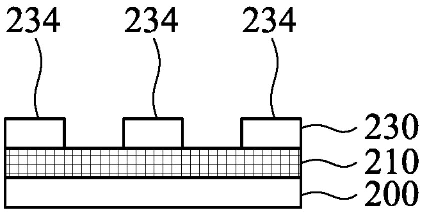

In FIG. 2D, the photoresist layer 230 has been developed to remove soluble portions 232, creating a photoresist pattern. This corresponds to step 130 of FIG. 1.

Figure 2E:
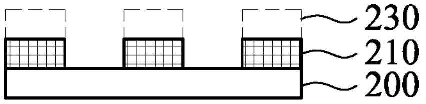

In FIG. 2E, the exposed portions of the material layer 210 are etched, transferring the photoresist pattern to the material layer. The photoresist layer is then removed (indicated as dashed lines). This corresponds to steps 140 and 170 of FIG. 1.

Figure 2F:
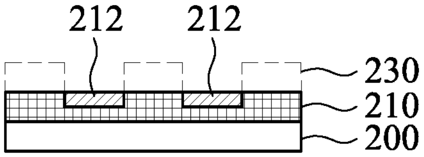

In FIG. 2F, alternatively, ion implantation is used to create doped regions 212 in the material layer 212. The photoresist layer is then removed (indicated as dashed lines). This corresponds to steps 150 and 170 of FIG. 1.

Figure 2G:
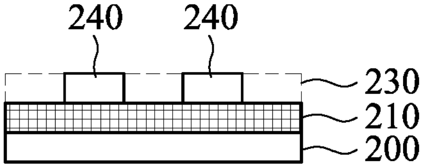

In FIG. 2G, alternatively, another material is deposited into the photoresist pattern to form a new layer 240 upon the material layer 210. The photoresist layer is then removed (indicated as dashed lines). This corresponds to steps 160 and 170 of FIG. 1.

The photosensitive copolymers have increased photosensitivity and increased etch resistance, as indicated by a low Ohnishi parameter. This improves contrast and pattern fidelity of the photoresist at the same radiation dosage.

Some embodiments of the present disclosure thus relate to methods for forming a photoresist pattern. A photoresist layer is formed on a substrate. The photoresist layer is patterned through exposure to radiation. The photoresist layer is then developed to form the photoresist pattern. The photoresist layer comprises a photosensitive copolymer that does not contain pendant carboxyl groups.

Other embodiments relate to methods for patterning a material layer in a semiconductor device. A photoresist layer is formed on the material layer. The photoresist layer is patterned through exposure to radiation. The photoresist layer is developed to form a pattern. The material layer is then etched to transfer the pattern to the material layer. The photoresist layer comprises a photosensitive copolymer that does not contain pendant carboxyl groups.

Other embodiments relate to photoresist compositions, which comprise a photosensitive copolymer; a photoacid generator; a quencher; and a solvent. The photosensitive copolymer comprises at least a first monomer and a second monomer. The first monomer contains a pendant polycyclic aromatic group, and the second monomer comprises an acid leaving group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photoresist pattern, comprising:
forming a photoresist layer on a substrate;
patterning the photoresist layer through exposure to radiation; and
developing the photoresist layer to form the photoresist pattern;
wherein the photoresist layer comprises a photosensitive copolymer that is devoid of pendant carboxyl groups;
wherein the photosensitive copolymer is a terpolymer having a first monomer, a second monomer, and a third monomer;
wherein the first monomer comprises a pendant polycyclic aromatic group, and wherein the second monomer comprises an acid leaving group; and
wherein the acid leaving group is an alkoxy group; a sulfonic group; a sulfonamide group; a fluorinated alcohol group; a phenolic alcohol group; an imido or methylene group substituted with one or more sulfonyl, alkylsulfonyl, or alkylcarbonyl groups; or an alkylcarbonate group; and
wherein the third monomer is ethylene or vinyl fluoride.

2. The method of claim 1, wherein the pendant polycyclic aromatic group of the first monomer is a naphthalene, indene, biphenyl, fluorene, anthracene, or phenanthrene group.

3. The method of claim 1, wherein the pendant polycyclic aromatic group of the first monomer includes at least one substituent which is —OH; C1-C15 alkyl; C1-C15 ether or polyether containing 1-3 oxygen atoms; C1-C15 carbonate;

C1-C15 acetal; a C3-C15 tertiary alcohol; a C3-C15 vic-diol; halogen; amino; nitro; or cyano; or a protected derivative thereof.

4. The method of claim 1, wherein the second monomer contains a pendant aromatic group or a pendant polycyclic aromatic group which is substituted with the acid leaving group.

5. The method of claim 1, wherein the photosensitive copolymer comprises from about 0.1 mole % to about 30 mole % of the first monomer.

6. The method of claim 1, wherein the photosensitive copolymer comprises from about 10 mole % to about 99.9 mole % of the second monomer.

7. The method of claim 1, wherein the third monomer is ethylene.

8. The method of claim 1, wherein the third monomer is vinyl fluoride.

9. The method of claim 1, wherein the photosensitive copolymer comprises from greater than zero to about 70 wt % of the third monomer.

10. The method of claim 1, wherein the photosensitive copolymer has an Ohnishi parameter of 4.0 or lower.

11. A method for patterning a material layer in a semiconductor device, comprising:

forming a photoresist layer on the material layer;

patterning the photoresist layer through exposure to radiation;

developing the photoresist layer to form a pattern;

etching the material layer to transfer the pattern to the material layer;

wherein the photoresist layer comprises a photosensitive copolymer that is a terpolymer having a first monomer, a second monomer, and a third monomer;

wherein the first monomer comprises a pendant polycyclic aromatic group, and wherein the second monomer comprises an acid leaving group; and wherein the acid leaving group is an alkoxy group; a sulfonic group; a sulfonamide group; a fluorinated alcohol group; a phenolic alcohol group; an imido or methylene group substituted with one or more sulfonyl, alkylsulfonyl, or alkylcarbonyl groups; or an alkylcarbonate group; and wherein the third monomer is ethylene or vinyl fluoride.

12. The method of claim 11, wherein the photosensitive copolymer is devoid of pendant carboxyl groups.

13. The method of claim 11, wherein the pendant polycyclic aromatic group of the first monomer is a naphthalene, indene, biphenyl, fluorene, anthracene, or phenanthrene group.

14. The method of claim 11, wherein the photosensitive copolymer comprises from about 0.1 mole % to about 30 mole % of the first monomer.

15. The method of claim 11, wherein the photosensitive copolymer comprises from about 70 mole % to about 99.9 mole % of the second monomer.

16. The method of claim 11, wherein the photosensitive copolymer comprises from greater than zero to about 70 wt % of the third monomer.

17. A photoresist composition, comprising:

a photosensitive copolymer;

a photoacid generator;

a quencher; and a solvent;

wherein the photosensitive copolymer is a terpolymer having a first monomer, a second monomer, and a third monomer;

wherein the first monomer contains a pendant polycyclic aromatic group, and wherein the second monomer comprises an acid leaving group; and wherein the acid leaving group is an alkoxy group; a sulfonic group; a sulfonamide group; a fluorinated alcohol group; a phenolic alcohol group; an imido or methylene group substituted with one or more sulfonyl, alkylsulfonyl, or alkylcarbonyl groups; or an alkylcarbonate group; and wherein the third monomer is ethylene or vinyl fluoride.

18. The photoresist composition of claim 17, further comprising a surfactant, a sensitizer, a crosslinking agent, a stabilizer, a dissolution inhibitor, a plasticizer, a colorant, an adhesion promoter, or a surface leveling agent.

19. The photoresist composition of claim 17, wherein the pendant polycyclic aromatic group of the first monomer is a naphthalene, indene, biphenyl, fluorene, anthracene, or phenanthrene group.

20. The photoresist composition of claim 17, wherein the photosensitive copolymer comprises from greater than zero to about 70 wt % of the third monomer.

* * * * *